(12) United States Patent
August et al.

(10) Patent No.: US 8,217,696 B2
(45) Date of Patent: Jul. 10, 2012

(54) ADAPTIVE DIGITAL PHASE LOCKED LOOP

(75) Inventors: Nathaniel J. August, Portland, OR (US); Hyung-Jin Lee, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 245 days.

(21) Appl. No.: 12/653,703

(22) Filed: Dec. 17, 2009

(65) Prior Publication Data

US 2011/0148489 A1    Jun. 23, 2011

(51) Int. Cl.
    *H03L 7/06*    (2006.01)
(52) U.S. Cl. .................. 327/159; 327/150; 327/158
(58) Field of Classification Search .................. 327/149, 327/150, 158, 159
    See application file for complete search history.

(56) References Cited

U.S. PATENT DOCUMENTS

| | | | |
|---|---|---|---|
| 6,809,598 B1 * | 10/2004 | Staszewski et al. | 331/16 |
| 7,091,895 B2 * | 8/2006 | Honma | 341/155 |
| 7,145,399 B2 * | 12/2006 | Staszewski et al. | 331/17 |
| 7,777,576 B2 * | 8/2010 | Waheed et al. | 331/17 |
| 7,856,212 B2 * | 12/2010 | Pellerano et al. | 455/76 |
| 8,054,137 B2 * | 11/2011 | Osman | 331/17 |
| 2002/0080901 A1 * | 6/2002 | Ham, III | 375/376 |
| 2003/0234693 A1 * | 12/2003 | Staszewski et al. | 331/16 |
| 2006/0038710 A1 * | 2/2006 | Staszewski et al. | 341/143 |
| 2006/0229046 A1 * | 10/2006 | Bult et al. | 455/252.1 |
| 2007/0085622 A1 * | 4/2007 | Wallberg et al. | 331/179 |
| 2008/0315960 A1 * | 12/2008 | Waheed et al. | 331/17 |
| 2009/0097609 A1 * | 4/2009 | Chang et al. | 375/376 |
| 2009/0108891 A1 * | 4/2009 | Sander et al. | 327/156 |
| 2009/0262877 A1 * | 10/2009 | Shi et al. | 375/376 |
| 2009/0325494 A1 * | 12/2009 | Staszewski et al. | 455/43 |
| 2010/0091688 A1 * | 4/2010 | Staszewski et al. | 370/277 |
| 2011/0099450 A1 * | 4/2011 | Chang et al. | 714/752 |
| 2011/0148489 A1 * | 6/2011 | August et al. | 327/159 |
| 2011/0273210 A1 * | 11/2011 | Nagaraj | 327/159 |

* cited by examiner

*Primary Examiner* — Lincoln Donovan
*Assistant Examiner* — Adam Houston
(74) *Attorney, Agent, or Firm* — Blakely, Sokoloff, Taylor & Zafman LLP

(57) ABSTRACT

In some embodiments, a digital PLL is disclosed with a dynamically controllable filter for changing the effective DPLL bandwidth in response to one or more real-time performance parameters such as phase error.

21 Claims, 3 Drawing Sheets

|  | Adaptive DPLL | Nominal BW DPLL | Low BW DPLL |
|---|---|---|---|
| Effective BW | 1.38 MHz | 1.38 MHz | 43 kHz |
| Single-Cycle Jitter | 5.90 ps RMS | 32.0 ps RMS | 5.01 ps RMS |
| N-cycle Jitter | 18.0 ps RMS | 178 ps RMS | 251 ps RMS |

|  | Adaptive DPLL | Nominal BW DPLL | Low BW DPLL |
|---|---|---|---|
| Effective BW | 1.38 MHz | 1.38 MHz | 43 kHz |
| Single-Cycle Jitter | 5.7 ps RMS | 31.6 ps RMS | 5.01 ps RMS |
| N-cycle Jitter | 89.1 ps RMS | 240 ps RMS | 251 ps RMS |

_US 8,217,696 B2_

ADAPTIVE DIGITAL PHASE LOCKED LOOP

TECHNICAL FIELD

The present invention relates generally to digital phase locked loop circuits and in particular, to loop bandwidth control methods and circuits.

BRIEF DESCRIPTION OF THE DRAWINGS

Embodiments of the invention are illustrated by way of example, and not by way of limitation, in the figures of the accompanying drawings in which like reference numerals refer to similar elements.

DETAILED DESCRIPTION

Many contemporary PLL (phase locked loop) circuits are implemented using analog PLLs, which can be sensitive to manufacturing processes, especially with processes involving ever smaller transistor features. Accordingly, digital PLL (all and/or partially digital) PLLs are being more widely used. Unfortunately, however, digital PLL functional units such as digital phase-frequency detectors (DPFDs) and digitally controlled oscillators (DCOs) have their own drawbacks such as their introduction of quantization noise into the loop. These and other noise sources can degrade the phase noise and jitter performance of the output clock.

Disclosed herein are approaches for redressing these issues. In some embodiments, a digital PLL is used with a dynamically controllable filter for changing the effective DPLL bandwidth in response to one or more real-time performance parameters such as phase error. When high bandwidth is not needed, it can be controlled to be at a relatively low level, thereby reducing the jitter of the output clock. On the other hand, when high bandwidth is required, e.g., when the phase error in the loop is high, the filter can be controlled to provide a relatively high loop bandwidth to make the loop more responsive for tracking the reference clock.

Figure 1A:
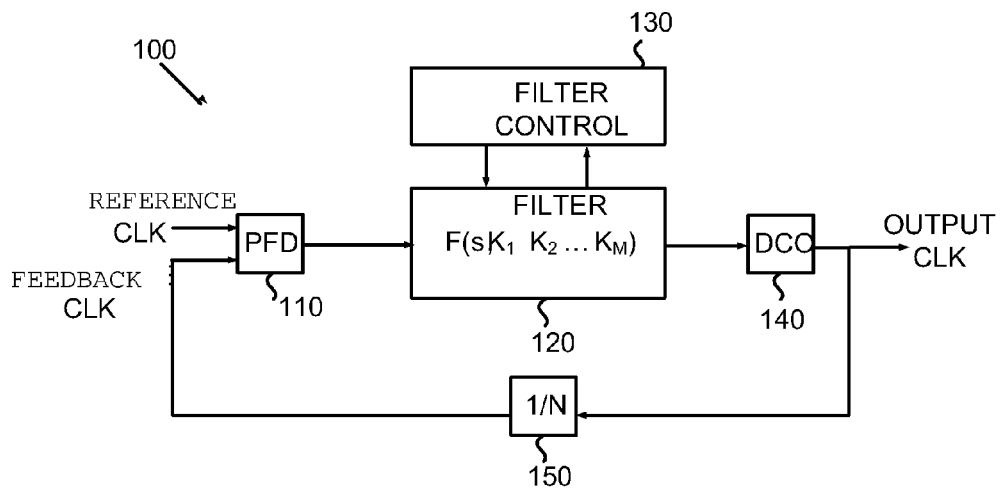
FIG. 1A is a diagram of a digital phase locked loop (DPLL) with adaptive bandwidth in accordance with some embodiments.

FIG. 1A illustrates an example of a digital (all digital in this case) phase locked loop 100. The DPLL 100 includes a digital phase-frequency detector (PFD) 110, a digital filter 120, a filter control block 130 for the digital filter 120, a digitally controlled oscillator 140, and a divider 150.

The DPLL 100 provides a stable output clock by actively fixing the phase and frequency of the feedback clock to the reference clock. The DCO 140 produces a discrete set of output frequencies. The I/N divider 150 generates one feedback clock cycle for every N clock cycles from the DCO 140.

If the phase of the feedback clock deviates from the phase of the reference clock, the PFD 110 will produce a quantized output (digital value of one or more bits, depending on the bit resolution used within the loop and/or PFD) proportional to the phase error. The output from the PFD 110 then induces a correction to the frequency of the DCO 140 via the digital filter 120.

To use a valid Laplacian-domain linear model, the DPLL may employ linearization techniques, such as reference clock dithering or sigma-delta modulation. With such linearization techniques, the digital filter 120 may implement stabilization zeros and properly-placed poles with a combination of M adjustable filter coefficients ($K_1, K_2, \ldots K_M$). Along with the gain of the PFD 110 and the gain of the DCO 140, these filter coefficients will normally determine the open loop characteristics and closed-loop characteristics of the DPLL 100. Typically important closed-loop characteristics include bandwidth and jitter peaking. However, even when the DPLL 100 has been linearized, quantization noise still likely exists within the DPLL 100 loop, and the noise that feeds through the digital filter 120 degrades the phase noise and jitter of the DCO 140.

Figure 1B:
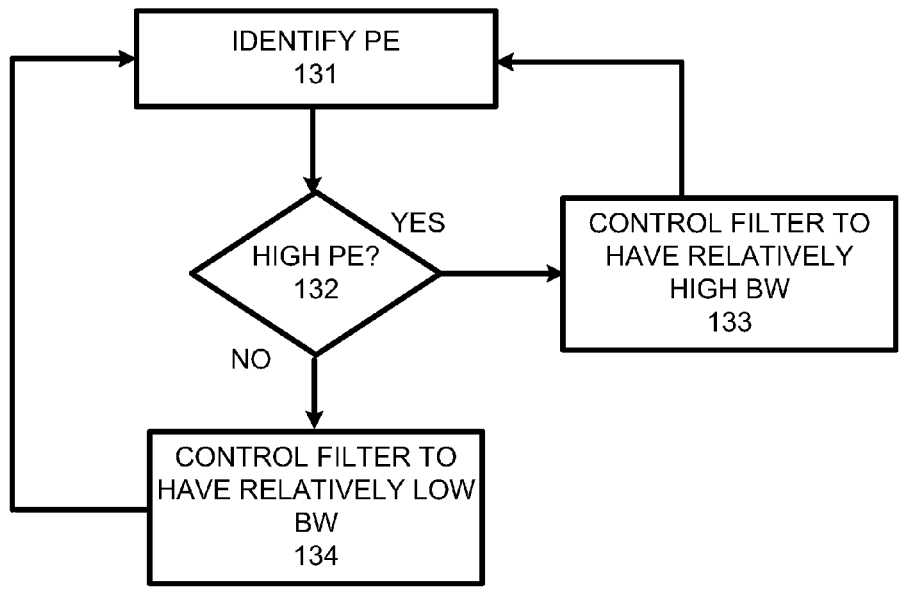
FIG. 1B is a flow diagram showing a routine for controlling bandwidth in a DPLL such as that shown in FIG. 1A in accordance with some embodiments.

With additional reference to FIG. 1B, a method for controlling the filter 130 using the filter control unit 120 is illustrated. At 131, the control unit identifies a phase error (between the digital feedback and reference clock signals) in the loop. The PE information may be obtained from the filter 120, which may share its internal state information (such as frequency and phase error) with the control unit 130. Alternatively, the control unit 130 could obtain PE data from the PFD or some other suitable source in the DPLL. It may identify a value that has already been processed for use by the control unit 130, or it may process data itself to identify an appropriate PE value. (Note that PE, as used herein, encompasses phase error, frequency error, and/or other parameters, and any suitable combinations of the same, that are indicative of the PLL's error in tracking the output clock to the reference clock.)

At 132, the control unit 130 determines if the PE is high. This determination may be made in any suitable way, taking into account one or various different factors. For example, a static or dynamic scale, implemented with digital logic, could be used. If it is determined that the PE is not high, then at 134, the control unit 130 controls the filter 120 to provide a relatively low BW. The control unit 130 adjusts or maintains the parameters ($K_1, K_2, \ldots, K_M$) according to the PE to control DPLL loop bandwidth (BW) (i) to be high enough, in association with the average expected (or observed) noise level in the loop to provide sufficiently accurate tracking, and (ii) small enough so that the DPLL does not incur excessive jitter while maintaining jitter peaking.

On the other hand, at 132, if determined that the PE is high, then at 133, the control unit 130 controls the filter to provide a relatively high loop BW, and the routine proceeds back to 131 to identify PE value once again. In this way, the control unit 130 maintains stability by setting a higher loop bandwidth in the case of an instantaneously high frequency and/or phase error level. Because of the digital nature of the filter 120, the bandwidth can be dynamically altered at speeds up to the sampling (or clocking) frequency for the filter.

Figure 2:
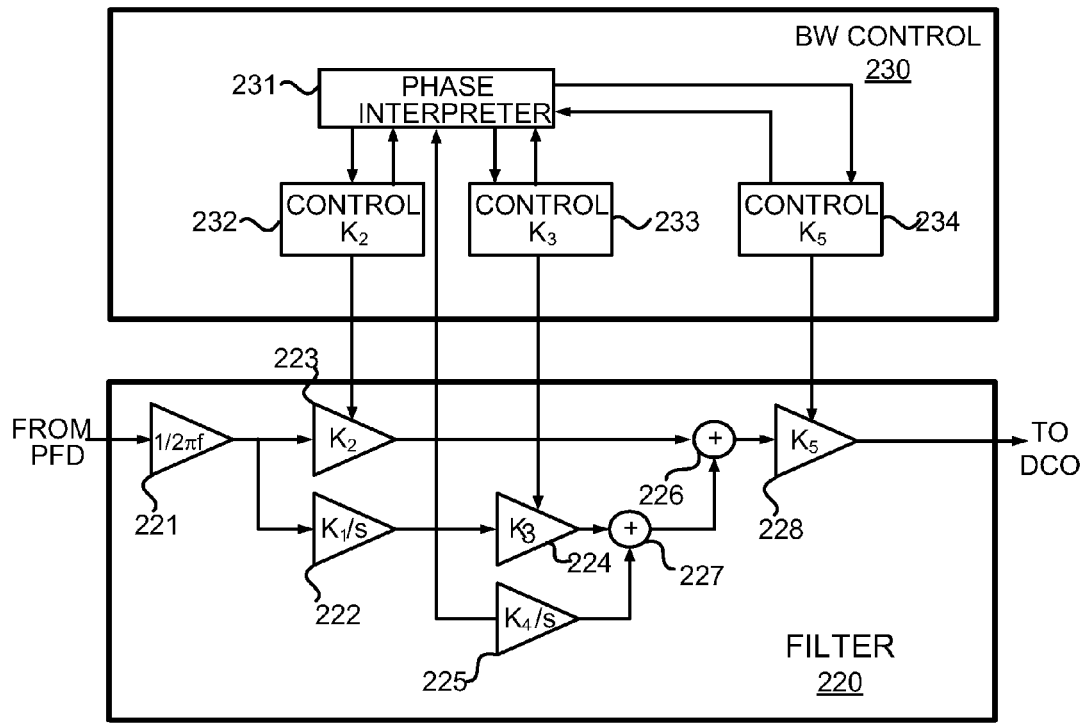
FIG. 2 is a diagram of bandwidth control and filter blocks for a DPLL such as the DPLL of FIG. 1 in accordance with some embodiments.

FIG. 2 shows an exemplary filter control unit 230 and filter 220 suitable for use in the DPLL loop of FIG. 1. The control unit 230 comprises a phase interpreter 231 for identifying (calculating, estimating, receiving and/or the like) current PE values and coefficient control blocks 232 through 234. The phase interpreter 231 identifies phase error (PE) in the loop, while the coefficient control blocks update the K coefficients that are to vary, as dictated by a particular design. The filter 220 comprises arithmetic logic blocks 221 through 228 (integrators, multipliers, summers, etc.), configured as shown, to implement the filter pursuant to the equations set forth below.

The filter utilizes an in-loop linearization technique and is characterized with five filter coefficients [K1, K2, K3, K4, K5]. (Of course, any suitable filter configuration could be used. Persons of skill will appreciate that there are numerous different combinations of filter designs, e.g., more or less coefficients, pole/zero combinations, etc., that could suffice in this context to provide adequate, dynamically adjustable loop bandwidth and at the same time, not incur instability.)

The open loop system response of this DPLL 220 can be described by the following equations $$H_{ol}(s) = K_{ol} \frac{s + \omega_z}{s^2(s + \omega_p)}$$

$$K_{ol} = \frac{K_1 K_3 K_5}{2\pi N}$$

$$\omega_p = \frac{K_2 K_5}{2\pi N}$$

$$\omega_z = \frac{K_4}{K_3}$$

where $H_{ol}$ is the open loop transfer function; $K_{ol}$ is the open loop gain, $\omega_p$ is the pole frequency, and $\omega_z$ is the zero frequency. Note that each of $H_{ol}$, $K_{ol}$, $\omega_p$, and $\omega_z$ are also functions of one or more of the filter coefficients ($K_1$, $K_2$, $K_3$, $K_4$, and $K_5$).

The control block 230 dynamically adjusts the adjustable coefficients of the filter 220 to reduce (or maintain) the loop bandwidth at a suitable low level for maintaining reasonably low jitter and, at the same time, is high enough to provide suitably low phase noise (tracking response) under steady sate operational conditions (e.g., average expected phase noise). In this example, the jitter peaking is proportional to $K_2 \times K_3 \times K_5$; the bandwidth is proportional to $K_2 \times K_5$; and the jitter feed through between the input and the output of the filter 220 is also proportional to $K_2 \times K_5$. In this particular digital filter architecture, the phase error is proportional to the output of the first integrator 222. In some embodiments, to ensure stability, the poles and zeros are selected such that the pole frequency ($\omega_p$) is at least nine times greater than the zero frequency ($\omega_z$.)

In some embodiments, once during every control clock cycle (clock used to drive the control and likely the filter blocks, e.g., the reference clock may be used for this control clock), the control block 230 updates the existing values of K2, K3, and K5 to some new values of $K_2'$, $K_3'$, and $K_5'$ based on the phase error and the existing values of the filter parameters. (Of course, values such as PE and the output K parameter values may be updated more or less frequently, depending on available resources and performance objectives.) The phase interpreter 231 gathers the raw phase error at the output of the first integrator 222 and the current values of the parameters from each of the control blocks CONTROL $K_2$ 232, CONTROL $K_3$ 233, and CONTROL $K_5$ 234 to identify (e.g., calculate, estimate, etc.) a new PE value. (Note that with this example, the values of $K_1$ and $K_4$ are fixed, so these are always known by the phase interpreter 231). In some embodiments, the phase interpreter 231 calculates the true phase error by scaling the raw phase error by the current gain of the filter, as given by the current coefficient values.

Figure 3:
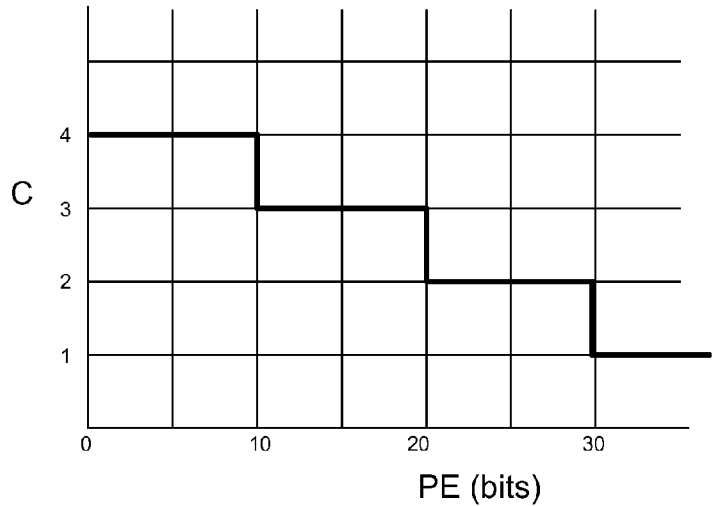
FIG. 3 is a graph showing exemplary bandwidth (BW) control value [C] levels versus phase error (PE), suitable for use with the BW control unit of FIG. 2.

In some embodiments, in order to implement a filter control routine as set forth in FIG. 1B, and to maintain stability and linearization of the DPLL 100, the control unit 230 calculates and updates the adjustable K coefficients using a value [C] that is inversely correlated with the determined phase error PE. Any suitable function could be used for C, as a function of PE. One suitable correlation, a stepwise function, is illustrated with the graph of FIG. 3.

In some embodiments, the CONTROL $K_3$ block 233 adjusts $K_3$ such that $K_3' \leftarrow K_3 \times C$; the CONTROL $K_2$ block 232 adjusts $K_2$ such that $K_2' K_2 \times C^2$; and the CONTROL $K_5$ block 234 adjusts $K_5$ such that $K_5' \leftarrow K_5 \div C^3$, where C is greater than one and varies inversely with the current phase error. With the example using the C function of FIG. 3, a downward progressing, stepwise function is used, although any desired function may be used.

As the phase error decreases, the automatic adjustments dynamically reduce both the loop bandwidth and the jitter by a factor of C because both are proportional to $K_2 \times K_5$. The jitter peaking remains constant because it is proportional to $K_2 \times K_3 \times K_5$. This provides the best jitter performance at a given total noise level (which is typically dominated by quantization noise).

It may be appreciated that the use of such a control block 230 need not add significant power or area to the existing filter architecture. The phase interpreter 231, CONTROL K2 block 232, CONTROL K3 block 233, and CONTROL K5 block 234 may increase power and area in some implementations by less than 5% because multiplications can readily be implemented using relatively simple digital logic units such as shifts-and-add operations, etc.

Figures 4, 5A, 5B:
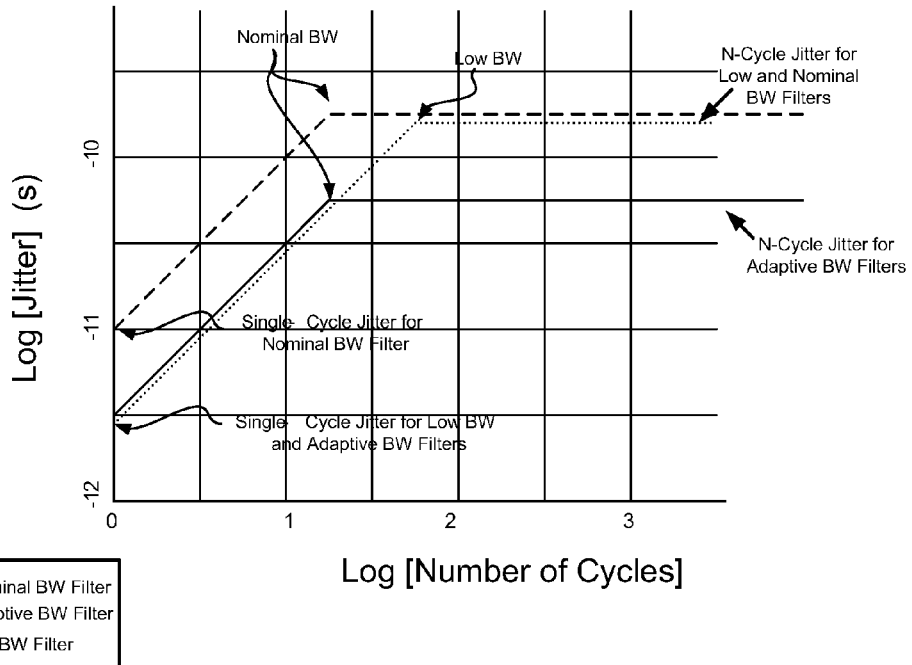
FIG. 4 is a graph showing expected jitter for a DPLL with the BW control unit and filter of FIGS. 1 and 2.
FIG. 5A is a table showing simulated jitter and effective bandwidths for DPLLs with different BW implementations.
FIG. 5B is a table showing jitter and effective bandwidths for test chip DPLLs with different BW implementations.

With dynamic BW adjustment, as described herein, the effective DPLL loop bandwidth is determined by the maximum speed that the loop can correct phase errors (i.e., the maximum allowed bandwidth as dictated by the filter control unit and filter pursuant to a given design), even though the loop need not be at this bandwidth for most of its operation. Although the instantaneous loop bandwidth is reduced by a factor of C, the maximum loop bandwidth (at C=1) is essentially the effective loop bandwidth, since the control block 230 can adjust the parameters to quickly correct large phase errors when necessary. This is illustrated in FIG. 4, which indicates how the filter control unit can maintain a large effective loop bandwidth while reducing jitter. This figure does not represent measurements or simulation results (which are shown in the tables of FIG. 5). Rather, it is a diagram meant to demonstrate the motivation for using the control unit and adaptive filter. It plots the magnitude of the jitter on the y-axis that is accumulated over the number of output clock cycles on the x-axis. The figure assumes that quantization noise dominates other noise sources, as is typical in a DPLL. The three lines plotted in FIG. 4 represent the accumulated jitter of the output clock due to quantization noise for three different DPLL architectures (fixed low BW, fixed nominal BW, and adaptive BW) with the filter implementation 220 in FIG. 2.

As indicated in FIG. 4, at a low number of cycles (high frequencies of quantization noise), jitter increases with a slope of 1 because the DPLL cannot correct for the quantization noise at frequencies higher than the DPLL bandwidth. At a higher number of cycles (frequencies of quantization noise within the DPLL bandwidth), the DPLL corrects for the quantization noise, which levels off at the N-cycle jitter level. Thus, in the DPLL, the bandwidth affects both the single-cycle jitter feed through and the N-cycle jitter. The filter control unit and adaptive filter enables both the single-cycle jitter and N-cycle jitter to be at desired levels for a given range of bandwidths in a particular filter.

FIGS. 5A and 5B show tables with simulated and measured performance parameters for the three different DPLL BW cases: low BW, nominal BW, and adaptive BW (able to range between Low and Nominal). The table in FIG. 5A displays the simulated jitter and effective bandwidths for the three DPLL BW cases. As expected, the single-cycle jitter for the DPLL with adaptive bandwidth is close to that of the fixed low bandwidth case and is better than that of the fixed nominal bandwidth case. Further, the adaptive BW DPLL achieves much better N-cycle jitter than the other two cases.

The table of FIG. 5B displays test chip measurements of the jitter and effective bandwidths for the nominal and adaptive DPLL cases. (For the low fixed bandwidth case, the table repeats the simulation results from FIG. 5B because this case does not lock in silicon, whereas simulations can manually initialize the DPLL in a state guaranteed to lock.) The silicon measurements of N-cycle jitter are worse for both the adaptive bandwidth case and for the fixed nominal bandwidth case because of additional deterministic noise caused by power supply coupling, but the expected results (taking into account noise that could be efficiently redressed) do hold for the test chip measurements. A DPLL with adaptive BW can achieve measured single-cycle jitter that is close to that of the fixed low bandwidth case and that is better than that for the fixed nominal bandwidth case. Further, the adaptive DPLL case can achieve much better measured N-cycle jitter than the other two cases.

It should be appreciated that although the above DPLL is described with filter 220, the invention is not so limited and applies to other DPLL filter architectures (e.g., a proportional-integral loop filter or a proportional-integral-differential loop filter), which may or may not employ linearization techniques. Along these lines, a DPLL in accordance with embodiments of the present invention are not limited to any particular application. DPLLs find a wide variety of applications, such as frequency synthesis, clock recovery, clock multiplication, and clock regeneration, to mention just a few. Moreover, inventive embodiments may be used in many different integrated circuit environments (e.g., application-specific integrated circuits, field programmable gate arrays, graphics processors, general purpose processors, etc.) using high-frequency clocks, e.g., f or clocking digital logic, for synchronizing high-speed I/O, and for recovering clocks from RF communications.

In the preceding description, numerous specific details have been set forth. However, it is understood that embodiments of the invention may be practiced without these specific details. In other instances, well-known circuits, structures and techniques may have not been shown in detail in order not to obscure an understanding of the description. With this in mind, references to "one embodiment", "an embodiment", "example embodiment", "various embodiments", etc., indicate that the embodiment(s) of the invention so described may include particular features, structures, or characteristics, but not every embodiment necessarily includes the particular features, structures, or characteristics. Further, some embodiments may have some, all, or none of the features described for other embodiments.

In the preceding description and following claims, the following terms should be construed as follows: The terms "coupled" and "connected," along with their derivatives, may be used. It should be understood that these terms are not intended as synonyms for each other. Rather, in particular embodiments, "connected" is used to indicate that two or more elements are in direct physical or electrical contact with each other. "Coupled" is used to indicate that two or more elements co-operate or interact with each other, but they may or may not be in direct physical or electrical contact.

The term "PMOS transistor" refers to a P-type metal oxide semiconductor field effect transistor. Likewise, "NMOS transistor" refers to an N-type metal oxide semiconductor field effect transistor. It should be appreciated that whenever the terms: "MOS transistor", "NMOS transistor", or "PMOS transistor" are used, unless otherwise expressly indicated or dictated by the nature of their use, they are being used in an exemplary manner. They encompass the different varieties of MOS devices including devices with different VTs, material types, insulator thicknesses, gate(s) configurations, to mention just a few. Moreover, unless specifically referred to as MOS or the like, the term transistor can include other suitable transistor types, e.g., junction-field-effect transistors, bipolar-junction transistors, metal semiconductor FETs, and various types of three dimensional transistors, MOS or otherwise, known today or not yet developed.

The invention is not limited to the embodiments described, but can be practiced with modification and alteration within the spirit and scope of the appended claims. For example, it should be appreciated that the present invention is applicable for use with all types of semiconductor integrated circuit ("IC") chips. Examples of these IC chips include but are not limited to processors, controllers, chip set components, programmable logic arrays (PLA), memory chips, network chips, and the like.

It should also be appreciated that in some of the drawings, signal conductor lines are represented with lines. Some may be thicker, to indicate more constituent signal paths, have a number label, to indicate a number of constituent signal paths, and/or have arrows at one or more ends, to indicate primary information flow direction. This, however, should not be construed in a limiting manner. Rather, such added detail may be used in connection with one or more exemplary embodiments to facilitate easier understanding of a circuit. Any represented signal lines, whether or not having additional information, may actually comprise one or more signals that may travel in multiple directions and may be implemented with any suitable type of signal scheme, e.g., digital or analog lines implemented with differential pairs, optical fiber lines, and/or single-ended lines.

It should be appreciated that example sizes/models/values/ranges may have been given, although the present invention is not limited to the same. As manufacturing techniques (e.g., photolithography) mature over time, it is expected that devices of smaller size could be manufactured. In addition, well known power/ground connections to IC chips and other components may or may not be shown within the FIGS, for simplicity of illustration and discussion, and so as not to obscure the invention. Further, arrangements may be shown in block diagram form in order to avoid obscuring the invention, and also in view of the fact that specifics with respect to implementation of such block diagram arrangements are highly dependent upon the platform within which the present invention is to be implemented, i.e., such specifics should be well within purview of one skilled in the art. Where specific details (e.g., circuits) are set forth in order to describe example embodiments of the invention, it should be apparent to one skilled in the art that the invention can be practiced without, or with variation of, these specific details. The description is thus to be regarded as illustrative instead of limiting.

What is claimed is:

1. A chip comprising:
   a Digital Phase Locked Loop (DPLL) with a controllable filter for varying loop bandwidth as the DPLL is in operation, the controllable filter to increase the loop bandwidth when identifying sufficiently increased phase error in a loop of the DPLL; and a filter control unit to control the loop bandwidth through control of the controllable filter, the filter control unit having a phase interpreter to identify phase error.

2. The chip of claim 1, wherein the DPLL is an all digital PLL.

3. The chip of claim 1, wherein the controllable filter employs an in-loop linearization technique.

4. The chip of claim 1, wherein the controllable filter is a digital filter characterized by five or more coefficients.

5. The chip of claim 4, wherein three or more of the coefficients are controllably variable.

6. The chip of claim 1, wherein the filter control unit to control filter coefficients of the controllable filter, the filter coefficients used for controlling the loop bandwidth.

7. The chip of claim 6, wherein the filter control unit to control the filter coefficients for the loop bandwidth to be at a suitable low level for maintaining low jitter and but high enough to provide sufficient responsiveness for nominal phase noise conditions.

8. The chip of claim 1, wherein the controllable filter has a dominant pole that is at least nine times greater than a dominant zero in the controllable filter.

9. The chip of claim 1, wherein the phase interpreter to calculate the phase error by scaling a raw phase error value derived from the controllable filter.

10. The chip of claim 1, wherein the filter control unit to apply a step function for controlling the loop bandwidth in response to changes in the phase error.

11. The chip of claim 1, wherein the filter control unit to control the loop bandwidth to increase in response to intermittent increases in the phase error and then to go back to a normal low level.

12. The chip of claim 1, wherein the controllable filter is a digital filter characterized by two or more coefficients.

13. A method comprising:
in a control unit of a digital phase locked loop (DPLL) having a filter to be controlled by the control unit, identifying a phase error in the DPLL by calculating the phase error from data from the filter;
controlling the filter for the DPLL to have a high bandwidth if the phase error is too high; and
controlling the filter for the DPLL to have a lower bandwidth if the phase error is not too high.

14. The method of claim 13, wherein controlling the filter for a high bandwidth comprises adjusting coefficients for the filter to provide a bandwidth level that is proportional to the phase error.

15. The method of claim 13, wherein controlling the filter includes updating filter coefficients using arithmetic logic calculations within the control unit.

16. A computing system comprising:
a processor having at least one digital phase locked loop (DPLL) comprising:
an adjustably controllable digital filter; and
a control unit to control bandwidth of the DPLL by controlling the adjustably controllable digital filter, the control unit having a phase interpreter to identify phase error.

17. The system of claim 16, wherein the system comprises a display for information to be displayed to a user.

18. The system of claim 17, wherein the processor and the display are part of a portable wireless device.

19. The system of claim 16, wherein the adjustably controllable digital filter to be characterized by four or more coefficients.

20. The system of claim 19, wherein at least two of the coefficients of the four or more coefficients are controlled by the control unit.

21. The system of claim 16, wherein the control unit is operable to control the bandwidth to normally be at a sufficiently low level for acceptably low jitter and to be at a higher level in response to a sufficient phase error increase.

* * * * *